(12) United States Patent
Kawakami et al.

(10) Patent No.: US 6,990,173 B1
(45) Date of Patent: Jan. 24, 2006

(54) POSITIONING APPARATUS, ATMOSPHERE SUBSTITUTING METHOD, EXPOSURE APPARATUS, AND DEVICE MANUFACTURING METHOD

(75) Inventors: Eigo Kawakami, Utsunomiya (JP); Shinichi Hara, Kitakawabemachi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/577,608

(22) Filed: May 25, 2000

(30) Foreign Application Priority Data

Jun. 3, 1999 (JP) ................................ 11-157039

(51) Int. Cl.
*G21K 5/00* (2006.01)

(52) U.S. Cl. ........................................................ 378/34

(58) Field of Classification Search ............... 378/34

See application file for complete search history.

(56) References Cited

U.S. PATENT DOCUMENTS

| 4,969,168 A | 11/1990 | Sakamoto et al. | ............. 378/34 |
| 5,093,579 A | 3/1992 | Amemiya et al. | ....... 250/453.1 |
| 5,999,589 A | 12/1999 | Chiba et al. | .................. 378/34 |
| 6,616,898 B2 * | 9/2003 | Hara et al. | .................. 422/112 |

FOREIGN PATENT DOCUMENTS

JP 2-156625 6/1990

* cited by examiner

*Primary Examiner*—Craig E. Church
(74) *Attorney, Agent, or Firm*—Fitzpatrick, Cella, Harper & Scinto

(57) ABSTRACT

A positioning apparatus of an exposure apparatus includes a chamber, a substituting unit for substituting a gas in the chamber from a first gas to a second gas, a static pressure gas bearing provided in the chamber, a gas supply unit for supplying the second gas to the static pressure gas bearing, a control unit for controlling the gas supply unit to supply the second gas to the static pressure gas bearing when the substituting unit substitutes the gas in the chamber from the first gas to the second gas, and a bearing exhaust unit for exhausting the gas of the static pressure gas bearing.

23 Claims, 11 Drawing Sheets

POSITIONING APPARATUS, ATMOSPHERE SUBSTITUTING METHOD, EXPOSURE APPARATUS, AND DEVICE MANUFACTURING METHOD

FIELD OF THE INVENTION

The present invention relates to a positioning apparatus and an atmosphere substituting method applicable to a semiconductor exposure apparatus and the like, and an exposure apparatus and a device manufacturing method capable of using the positioning method and atmosphere substituting method. In recent years, an exposure technique using a synchrotron radiation beam is under development to cope with the shrinkage in feature size of semiconductor device. When a synchrotron radiation beam is used, attenuation of X-rays in air becomes a problem. In order to prevent this problem, for example, according to a method proposed in Japanese Patent Laid-Open No. 2-156625, an exposure positioning mechanism is set in a chamber having an He atmosphere with less X-ray attenuation, and He is used also as the working fluid for a static pressure type bearing used in the exposure positioning mechanism.

BACKGROUND OF THE INVENTION

Conventionally, in an exposure apparatus having such a positioning mechanism, if the apparatus is not to be operated for a long period of time, the exposure apparatus is turned off with the chamber being filled with nitrogen at an atmospheric pressure, so impure air will not enter the chamber from the outside. Also, when maintenance for machines in the chamber is to be performed, the chamber is filled with nitrogen, and then the chamber is partly opened to perform maintenance. In this manner, when the operation check of the wafer stage is to be performed with the chamber being filled with nitrogen or open to the atmosphere, nitrogen or dry air is used for a static pressure type bearing since exposure is not performed and in order to avoid consumption of expensive He.

With this prior art, after the operation of the wafer stage is checked, when exhausting nitrogen in the chamber to vacuum and substituting He for nitrogen to turn on the exposure apparatus, nitrogen or dry air left in the static pressure type bearing of the positioning mechanism gradually leaks into the chamber. Accordingly, it takes a long period of time for the He impurity in the exposure atmosphere in the chamber to reach a level at which exposure is possible.

The present invention has been made in view of the problem of the prior art, and has as its object to shorten a time required for the gas purity to reach a level at which exposure is possible in a positioning apparatus, atmosphere substituting method, exposure apparatus, and device manufacturing method using such a chamber, when substituting a gas in the chamber.

SUMMARY OF THE INVENTION

In order to achieve the above object, according to the present invention, a first positioning apparatus used in a chamber and using a static pressure gas bearing is characterized by comprising second gas supply means for supplying a second gas to the static pressure gas bearing when substituting a gas in the chamber from a first gas to the second gas.

In this arrangement, when substituting the gas in the chamber from the first gas to the second gas, if the second gas is supplied to the static pressure gas bearing, the first gas remaining in the static pressure gas bearing is eliminated. Hence, unlike in the prior art, the first gas remaining in the static pressure gas bearing does not leak over a long period of time. As a result, the second gas can reach a necessary purity at which, e.g., exposure is possible, faster, and substitution to the second gas is performed quickly.

According to the present invention, an atmosphere substituting method of substituting a gas in a chamber incorporating a positioning apparatus using a static pressure gas bearing from a first gas to a second gas is characterized by comprising the second gas supply step of supplying the second gas to the static pressure gas bearing in substituting the air in the chamber. With this arrangement, substitution to the second gas is similarly performed quickly.

According to the present invention, a second positioning apparatus including substituting means for substituting a gas in a chamber by exhausting a first gas from the chamber and introducing a second gas thereto and positioning means used in the chamber and using a static pressure gas bearing is characterized by comprising bearing exhaust means for exhausting the gas from the static pressure gas bearing through a pipe connected to the static pressure gas bearing.

In this arrangement, when exhausting the first gas in the chamber and introducing the second gas, if the first gas is exhausted through the pipe connected to the static pressure gas bearing, the first gas remaining in the static pressure gas bearing is exhausted. Hence, unlike in the prior art, the first gas remaining in the static pressure gas bearing does not leak over a long period of time. As a result, the second gas can reach a necessary purity at which, e.g., exposure is possible, faster, and substitution to the second gas is performed quickly. If exhaust of the first gas and exhaust of the static pressure gas bearing are performed simultaneously, a time required for exhausting the first gas is shortened, and substitution to the second gas is performed more quickly.

According to the present invention, an exposure apparatus including exposure means for exposing a target exposure substrate placed in a chamber and positioning means for positioning the target exposure substrate, the positioning means using a static pressure gas bearing and using as a working fluid the same type of gas as that of an atmosphere in the chamber, is characterized in that the positioning means comprises the above first and second positioning apparatuses arranged in the chamber.

In this arrangement, after the operation check of the positioning means is performed in the first gas atmosphere, when substituting the second gas for the first gas in order to start actual exposure, the second gas can quickly reach a purity, at which exposure is possible, with the first or second positioning apparatus of the present invention.

According to the present invention, a first device manufacturing method including the atmosphere substituting step of substituting a gas in a chamber incorporating a positioning apparatus using a static pressure gas bearing from a first gas to a second gas and the exposure step of positioning a target exposure substrate with the positioning apparatus and exposing a predetermined pattern after the atmosphere substituting step is characterized by comprising the second gas supply step of supplying the second gas to the static pressure gas bearing in substituting the gas in the atmosphere substituting step. Also, in this case, when substituting the second gas for the first gas, the second gas can quickly reach a purity at which exposure is possible. As a result, devices can be efficiently manufactured.

According to the present invention, a second device manufacturing step including the atmosphere substituting step of substituting a gas in a chamber by exhausting a first gas from a chamber incorporating a positioning apparatus using a static pressure gas bearing and introducing a second gas thereto and the exposure step of positioning a target exposure substrate with the positioning apparatus and exposing a predetermined pattern after the atmosphere substituting step is characterized by comprising the bearing exhaust step of exhausting the gas of the static pressure gas bearing through a pipe connected thereto simultaneously with exhausting the gas in the substituting step. In this case as well, the second gas can quickly reach a purity at which exposure is possible, and devices can be efficiently manufactured.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

In preferred embodiments of the present invention, when substituting the gas in the chamber from the first gas to the second gas, the gas in the chamber is substituted. The second gas is supplied to a static pressure gas bearing before a start of, simultaneously with, or after a start of substituting the gas. Note that the second gas is He, that the chamber is of an exposure apparatus, and that the exposure apparatus is an X-ray exposure apparatus employing a synchrotron radiation beam as an exposure beam. Further, the exposure apparatus is an exposure apparatus employing an $F_2$ laser beam as an exposure beam. Sometimes, substitution from the static pressure gas bearing is performed after the second gas is supplied to the static pressure gas bearing. The embodiments of the present invention will be described in more detail.

Figure 1:
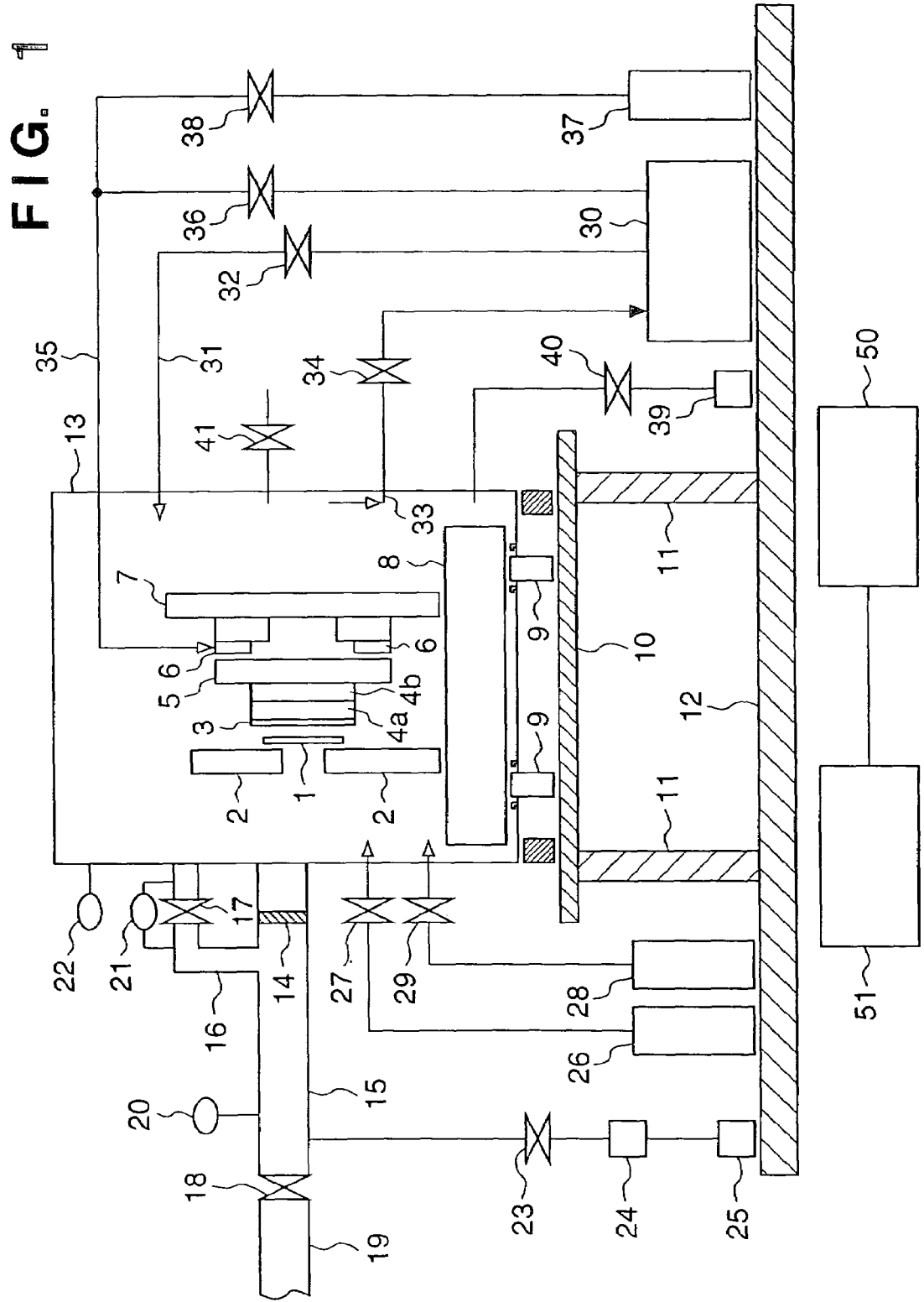
FIG. 1 is a view showing the arrangement of an exposure apparatus according to the first embodiment of the present invention.

FIG. 1 is a view showing the arrangement of an exposure apparatus according to the first embodiment of the present invention.

Referring to FIG. 1, reference numeral 1 denotes a mask; 2, a mask surface plate for supporting the mask 1; 3, a wafer; 4a, a wafer chuck; and 4b, a fine movement stage. The wafer 3 is drawn by vacuum suction and held with the mask 1, mask surface plate 2, wafer chuck 4a, and fine movement stage 4b. Reference numeral 5 denotes a coarse movement stage on which the fine movement stage 4b is set. The fine movement stage 4b is movable finely on the coarse movement stage 5. The coarse movement stage is movable in a long stroke. Reference numeral 6 schematically shows a gas bearing which supports and guides the coarse movement stage 5. The gas bearing 6 will be called an LHB hereinafter, which is an acronym for a linear He bearing.

Referring to FIG. 1, LHB 6 is mounted on the side of a stage surface plate 7. However, the invention is not limited to this. For example, LHB 6 may be mounted on the coarse movement stage to be opposed against a stage surface plate 7 discussed below.

Reference numeral 7 denotes a stage surface plate for supporting a wafer stage comprised of the fine movement stage 4b, coarse movement stage 5, and LHB 6 within a vertical plane. Referring to FIG. 1, the stage surface plate 7 supports the wafer stage within the vertical plane. However, the invention is not limited to this. For example, the stage surface plate 7 may support the wafer stage within the horizontal plane. Reference numeral 8 denotes a frame for supporting the mask surface plate 2 and stage surface plate 7; 9, support members 9 for supporting the frame 8 on a clean room floor 10; 11, support members for supporting the clean room floor 10 on a factory building floor 12; 13, a chamber for accommodating the exposure apparatus; and 14, a beryllium window for dividing a beam line 15, which is set at high vacuum during exposure from the chamber 13, and transmitting a synchrotron radiation beam through it.

Reference numeral 16 denotes a bypass line of the beryllium window 14 having a bypass valve 17; 18, a gate valve for disconnecting the beam line 15 from a beam line 19, which is connected to a synchrotron located upstream and always set at a high vacuum; 20, a high vacuum gauge; 21, a differential pressure sensor; 22, an absolute pressure sensor; and 24 and 25, vacuum exhaust pumps for evacuating the beam line 15 through a vacuum exhaust valve 23 to maintain it at a high vacuum.

Reference numeral 26 denotes an He supply unit for introducing He into the chamber 13 through an He supply valve 27; 28, a nitrogen supply unit for introducing nitrogen into the chamber 13 through a nitrogen supply valve 29; and 30, an He circulating unit 30 for compressing and purifying He in the chamber 13, which is recovered by an He recovering line 33 through an He recovering valve 34, adjusting it to a predetermined temperature and pressure, and returning it to the chamber 13 through a low-pressure He supply line 31 including a low-pressure He supply valve 32.

Reference numeral 35 denotes a high-pressure He supply line; for supplying high-pressure He generated by the He circulating unit 30 to the LHB 6 through a high-pressure He supply valve 36; 37, a nitrogen supply unit for supplying nitrogen, in place of He, to the LHB 6 through a nitrogen supply valve 38 when operating the wafer stage in an atmosphere; 39, a vacuum exhaust pump 39 for evacuating the chamber 13 through a vacuum exhaust valve 40. The vacuum exhaust pump 39 is set in the chamber 13 having an exhausted atmosphere. Reference numeral 41 denotes a valve for releasing the pressure in the chamber 13 to the atmosphere.

Figure 2:
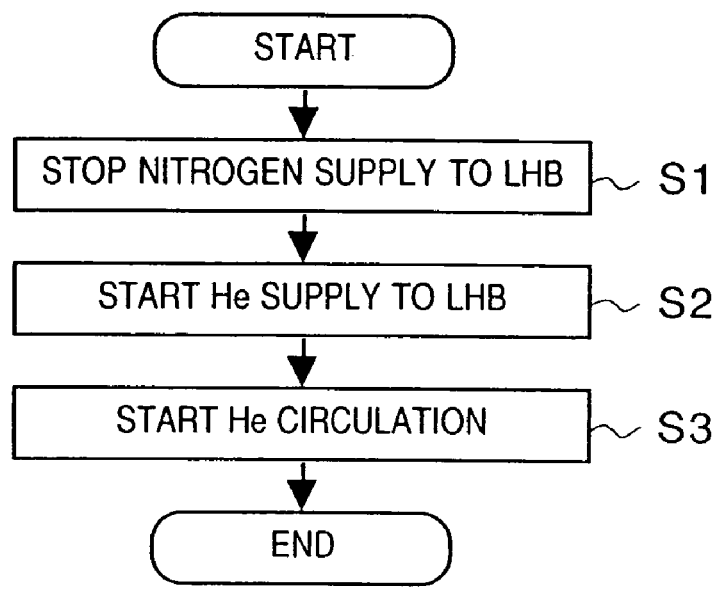
FIG. 2 is a flow chart showing a process in the arrangement of FIG. 1.

FIG. 2 is a flow chart showing a process used when checking, in the exposure apparatus described above, the operation of the wafer stage in an He atmosphere set at an atmospheric pressure. In this process, the respective portions of the apparatus are operated by a controller 50. The controller 50 controls the wafer stage, the vacuum exhaust pumps 24 and 25, the He supply unit 26, the nitrogen supply unit 28, the He circulating unit 30, the nitrogen supply unit 37, the vacuum exhaust pump 39 and valve controller 51. Further, the controller 50 may control the above units on the basis of outputs from the sensors 21 and 22. The valve controller 51 controls an operation of opening and shutting the above valves, an amount of throttle of the valve when the valve is a variable valve, and the like.

As shown in FIG. 2, when this process is started, nitrogen supply to the LHB 6 is stopped by closing the nitrogen supply valve 38 (step S1). The high-pressure He supply valve 36 is opened to start He supply to the LHB 6 (step S2). The low-pressure He supply valve 32 and He recovering valve 34 are opened, and the operation of the He circulating unit 30 is started, to start He circulation in the chamber 13 (step S3). Hence, impurity gases remaining in the LHB 6 and high-pressure He supply line 35 are cleared away, and nitrogen in the chamber 13 can be substituted by He quickly. The process of step S3 can be performed simultaneously with step S2.

Figure 3:
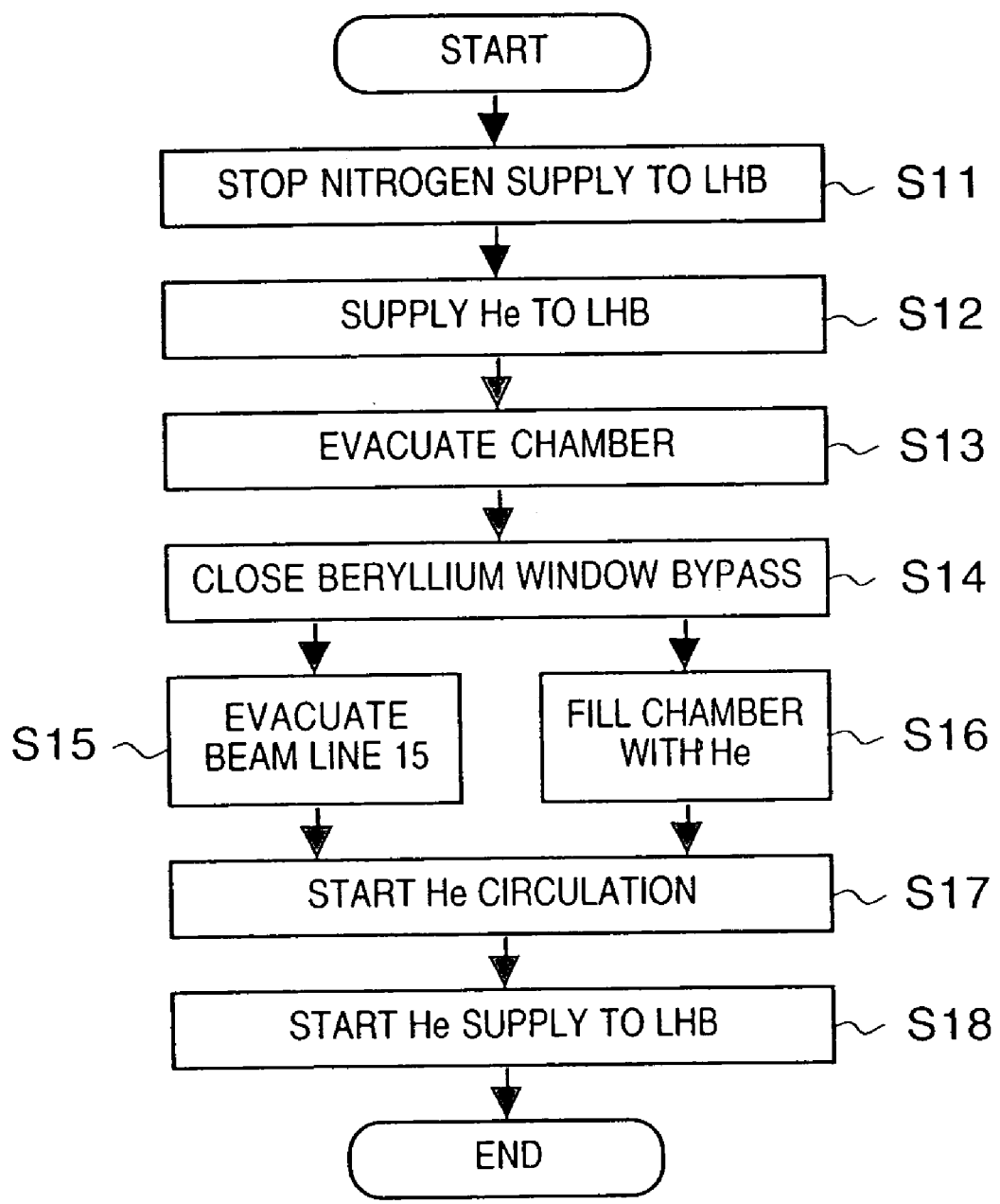
FIG. 3 is a flow chart showing a process in an exposure apparatus according to the second embodiment of the present invention.

FIG. 3 is a flow chart showing a process in an exposure apparatus according to the second embodiment of the present invention, which is performed when the exposure apparatus is to be turned on again after maintenance for machines in the chamber is ended or after long-term operation is stopped.

The arrangement of this exposure apparatus is identical to that shown in FIG. 1.

When the process is started, as shown in FIG. 3, if the wafer stage is used, a nitrogen supply valve 38 is closed to stop nitrogen supply to an LHB 6 (step S11). At this point in time, all the valves are close except a bypass valve 17 of a beryllium window 14 (and an atmosphere release valve 41 when a chamber 13 is opened to the atmosphere). A high-pressure He supply valve 36 is open for a predetermined period of time to supply He to the LHB 6 (step S12). Then, (if the atmosphere release valve 41 is open, after it is closed, and) a vacuum exhaust valve 40 is opened to start evacuating the chamber 13. Since the bypass valve 17 is open, the chamber 13 and a beam line 15 communicate with each other, so that they are evacuated simultaneously. When an absolute pressure sensor 22 confirms that the chamber 13 is evacuated to a predetermined pressure, the vacuum exhaust valve 40 is closed (step S13). Subsequently, the bypass valve 17 is closed (step S14).

An exhaust valve 23 for the beam line 15 is opened, the beam line 15 is set at a higher vacuum by two vacuum exhaust pumps 24 and 25 (e.g., a turbo molecular pump and a dry pump) (step S15). Along with this, an He supply valve 27 is opened to introduce He into the chamber 13. He is filled into the chamber 13 until the pressure in the chamber 13 indicated by the absolute pressure sensor 22 reaches a predetermined pressure. After that, the He supply valve 27 is closed (step S16).

A low-pressure He supply valve 32 and He recovering valve 34 are opened to start operation of an He circulating unit 30 (step S17). At this time point, the wafer stage can be driven. Thus, the high-pressure He supply valve 36 is opened to start He supply to the LHB 6 (step S18), and the wafer stage is initialized in accordance with a predetermined procedure. Simultaneously, a wafer transfer system and mask transfer system (not shown) are also initialized. When a high vacuum gauge 20 confirms that the beam line 15 is evacuated to the same vacuum degree as that of a beam line 19, a gate valve 18 can be opened to perform exposure.

Figure 9:
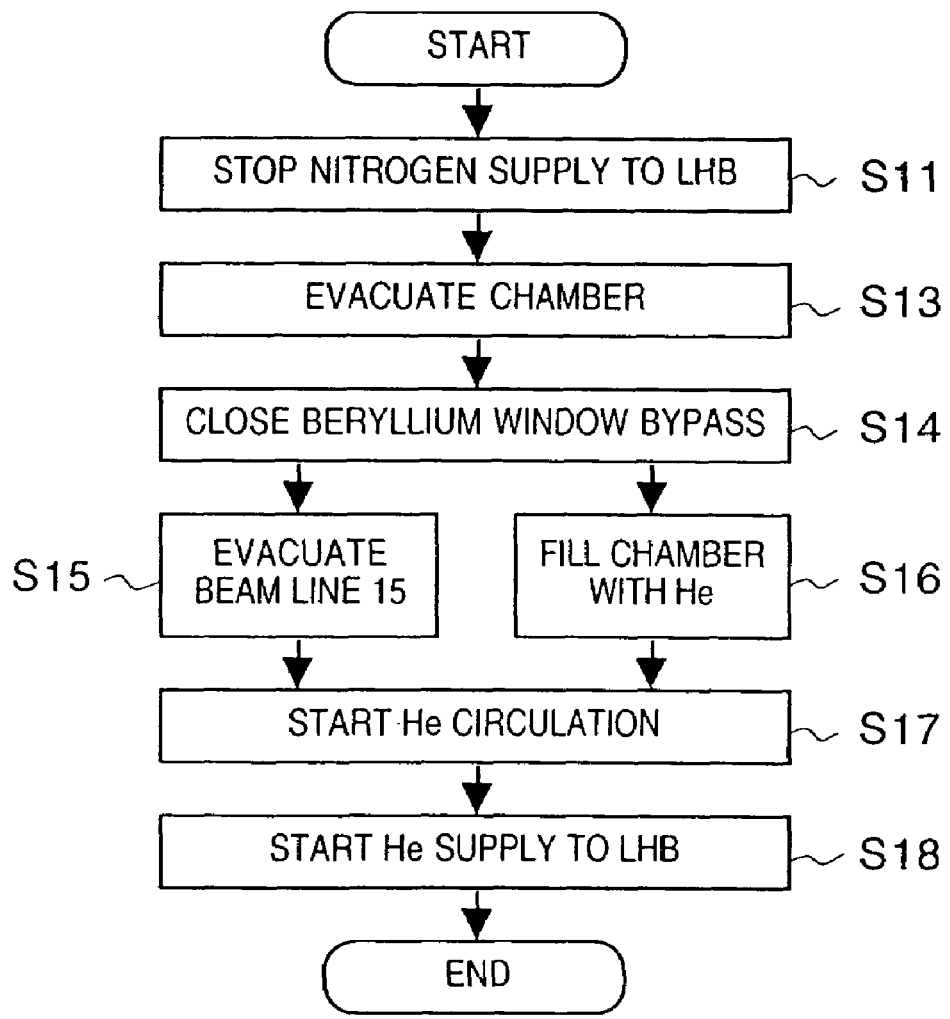
FIG. 9 is a flow chart showing a process in a prior art arrangement.

FIG. 9 shows a process similar to that of the prior art arrangement. In FIG. 9, steps where the same processes as those of the embodiment of FIG. 3 are performed are denoted by the same step numbers as in FIG. 3.

As is seen from FIGS. 3 and 9, the second embodiment is different from that of the prior art in that step S12 is added to it. According to this embodiment, in step S12, the high-pressure He supply valve 36 is open for a predetermined period of time to supply He to the LHB 6. Therefore, impurity gases remaining in the LHB 6 and high-pressure He supply line 35 can be cleared away and exhausted outside the chamber 13 in the following step S13. As a result, an He impurity degree at which exposure is possible can be reached quickly.

Figure 4:
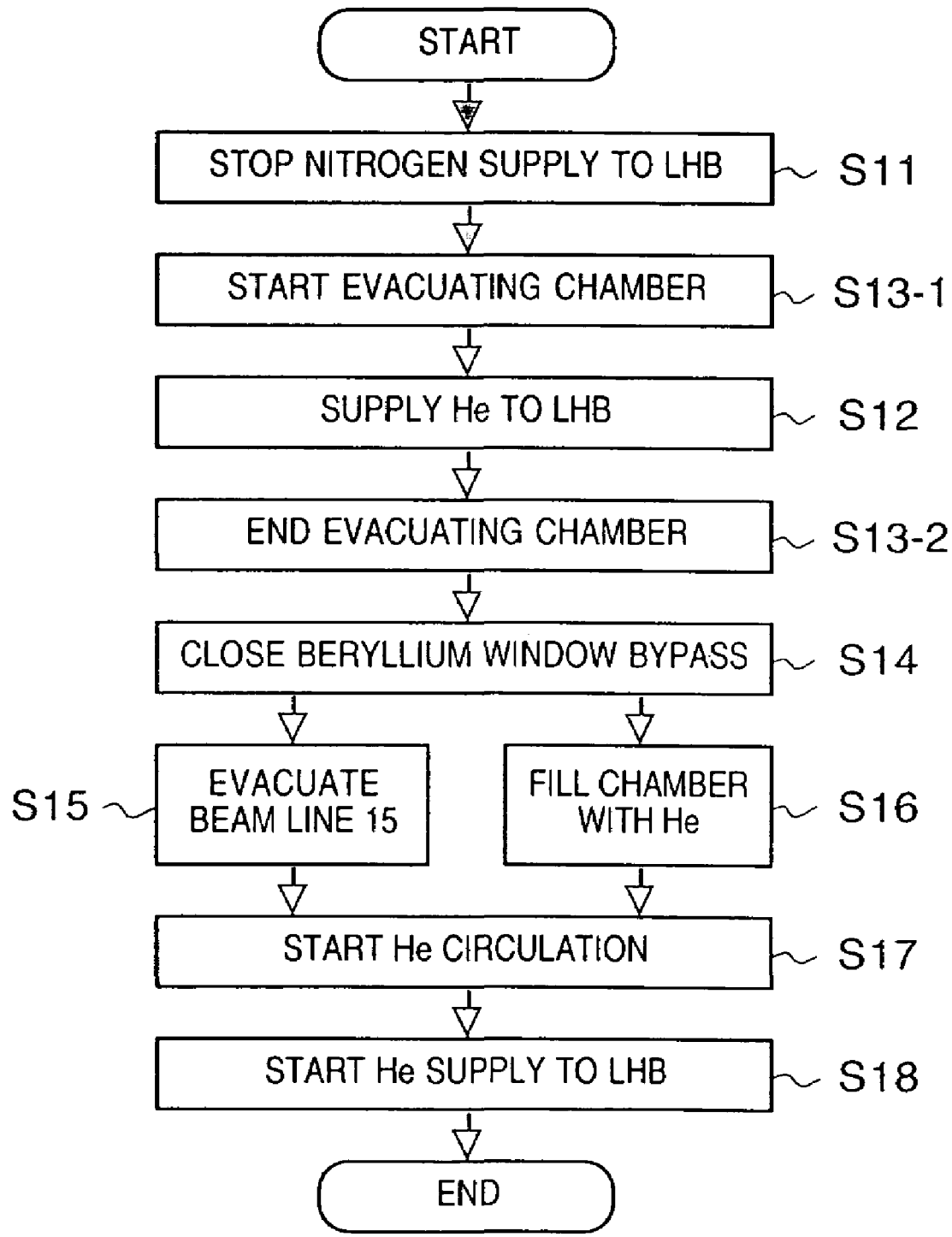
FIG. 4 is a flow chart showing a process in an exposure apparatus according to the third embodiment of the present invention.

FIG. 4 is a flow chart showing a process in an exposure apparatus according to the third embodiment of the present invention.

The process of FIG. 4 is different from that of FIG. 3 in that, while steps S12 and S13 are performed separately in FIG. 3, they are performed simultaneously in the third embodiment.

More specifically, after nitrogen supply to an LHB 6 is stopped (step S11), as shown in FIG. 4, a vacuum exhaust valve 40 is opened to start evacuating a chamber 13 (step S13-1), and He is supplied to the LHB 6 for a predetermined period of time (step S12). After the interior of the chamber 13 reaches a predetermined vacuum degree, the vacuum exhaust valve 40 is closed, and evacuation of the chamber 13 is ended (step S13-2). The operations from step S14 are identical to those of FIG. 3.

According to this embodiment, He is supplied to a high-pressure He supply line 35 and the LHB 6 while the chamber 13 is being evacuated. Therefore, the high-pressure He supply line 35 and LHB 6 can be rinsed to exhaust residual nitrogen.

Figure 5:
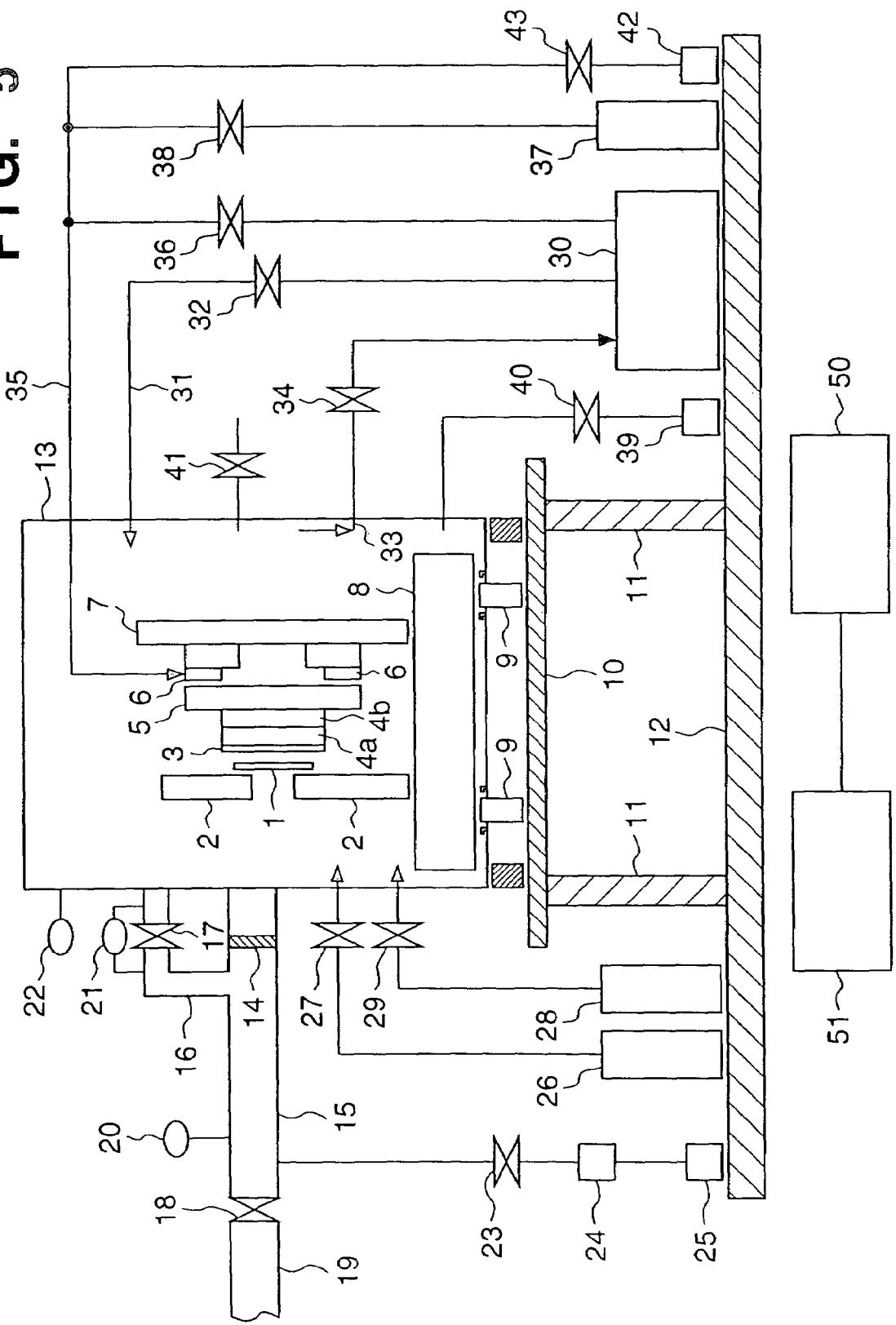
FIG. 5 is a view showing the arrangement of an exposure apparatus according to the fourth embodiment of the present invention.

FIG. 5 is a view showing the arrangement of an exposure apparatus according to the fourth embodiment of the present invention.

Referring to FIG. 5, reference numeral 42 denotes an exhaust pump for evacuating a high-pressure He supply line 35 through a high-pressure He supply line exhaust valve 43. Except for this, the arrangement of FIG. 5 is the same as that of FIG. 1, and elements having the same functions as those shown in FIG. 1 are denoted by the same reference numerals as in FIG. 1.

Figure 6:
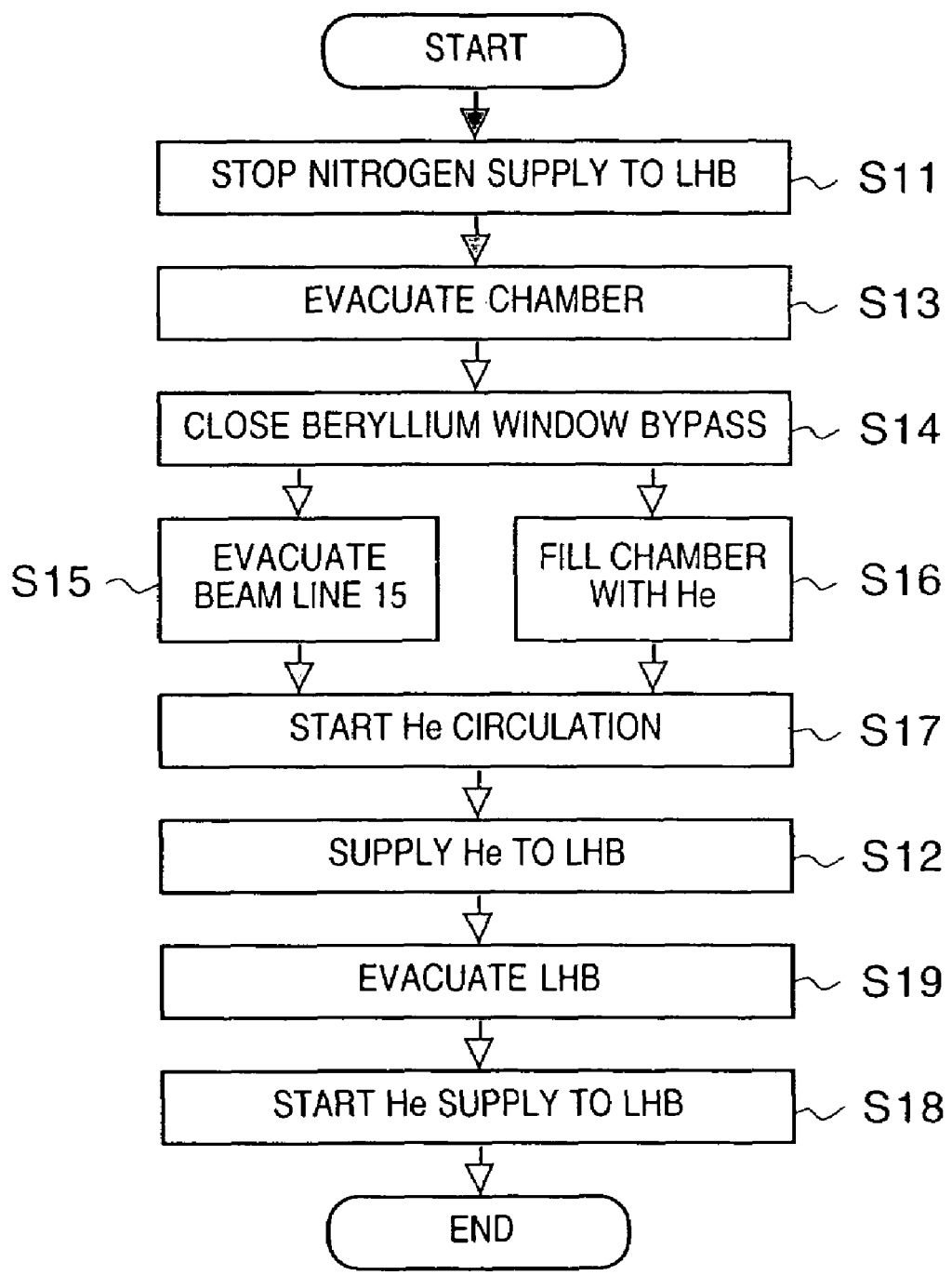
FIG. 6 is a flow chart showing a process in the exposure apparatus shown in FIG. 5.

FIG. 6 is a flow chart showing a process of this exposure apparatus.

In FIG. 6, the same process steps having the same contents as those of FIG. 3 are denoted by the same step numbers as in FIG. 3.

In this process, steps S11 to S17 are the same as steps S11 to S17 of FIG. 3 except for step S12. When a chamber 13 is completely filled with He (step S16) and the operation of an He circulating unit 30 is started (step S17), a high-pressure He supply valve 36 is opened to supply high-pressure He to an LHB 6 for a predetermined period of time, and the high-pressure He supply valve 36 is closed (step S12). A high-pressure He supply line exhaust valve 43 is opened, the LHB 6 and high-pressure He supply line 35 are evacuated by the exhaust pump 42 for a predetermined period of time, and thereafter the valve 43 is closed (step S19). Hence, nitrogen remaining in the LHB 6 and high-pressure He supply line 35 is exhausted. Then, the high-pressure He supply valve 36 is opened again to start He supply to the LHB 6 (step S18). With the above process, remaining nitrogen does not leak from the LHB 6, and a time required for setting He in the chamber 13 to a predetermined purity is shortened greatly.

Figure 7:
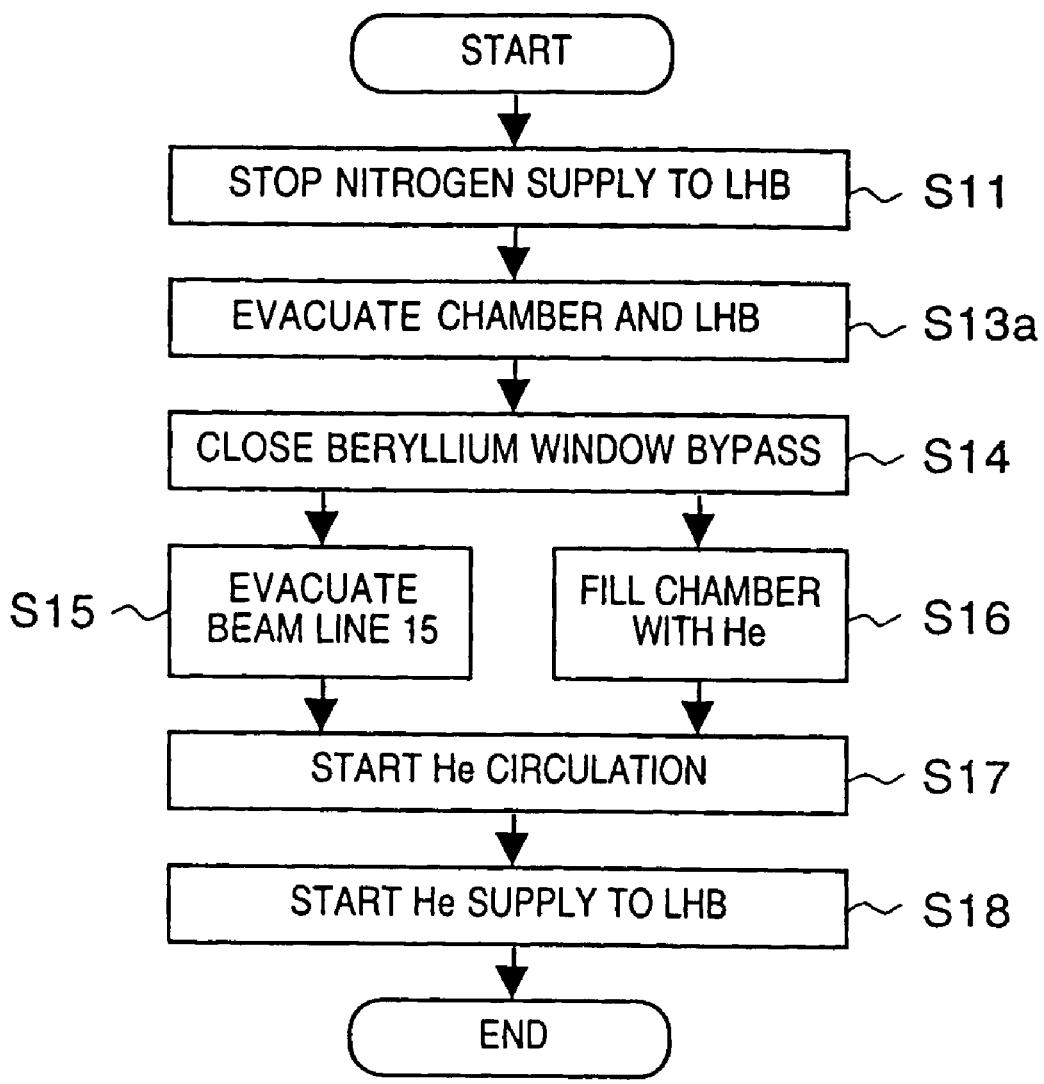
FIG. 7 is a flow chart showing a process in an exposure apparatus according to the fifth embodiment of the present invention.

FIG. 7 is a flow chart showing a process in an exposure apparatus according to the fifth embodiment of the present invention.

The arrangement of this exposure apparatus is identical to that shown in FIG. 5. In FIG. 7, the processing steps having the same contents as those of FIG. 6 are denoted by the same step numbers as in FIG. 6.

In this process, after nitrogen supply to an LHB 6 is stopped (step S11), in step S13a, chamber evacuation (step S13) and LHB evacuation (step S19) of FIG. 6 are performed simultaneously. More specifically, a vacuum exhaust valve 40 and high-pressure He supply line exhaust valve 43 are opened simultaneously, and the chamber 13 is evacuated by two vacuum exhaust pumps 39 and 42.

According to this embodiment, since removal of impurity gas remaining in the LHB 6 and in a high-pressure He supply line 35, and evacuation of a chamber 13 are performed simultaneously, and since the exhaust capability is increased by the two pumps, a time required for setting the interior in the chamber 13 to an He atmosphere can be shortened greatly.

Figure 8:
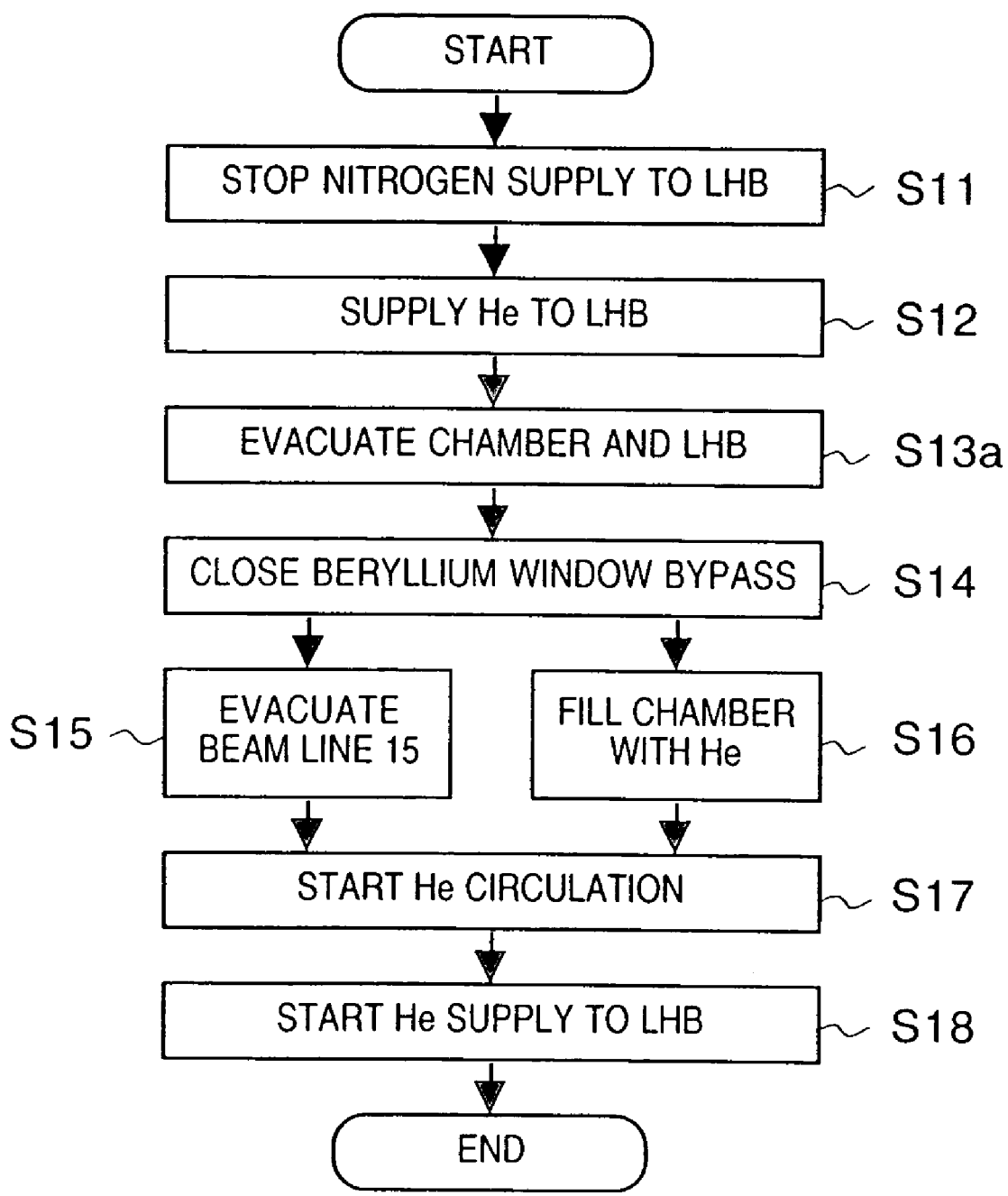
FIG. 8 is a flow chart showing a process in an exposure apparatus according to the sixth embodiment of the present invention.

FIG. 8 is a flow chart showing a process in an exposure apparatus according to the sixth embodiment of the present invention.

The arrangement of this exposure apparatus is identical to that shown in FIG. 5. In FIG. 8, the processing steps having the same contents as those of FIG. 7 are denoted by the same step numbers as in FIG. 7.

As shown in FIG. 8, after nitrogen supply to an LHB 6 is stopped (step S11), a high-pressure He supply valve 36 is open for a predetermined period of time to supply He to the LHB 6 (step 12). Then, two vacuum exhaust valves 40 and 43 are opened simultaneously to evacuate a chamber 13 with corresponding two vacuum exhaust pumps 39 and 42 (step S13a). The operations from steps S14 are identical to those of FIG. 3.

According to this embodiment, because of the process of step S13a, a time required for evacuating the chamber 13 can be shortened. As a time required for He to reach a predetermined purity, after the chamber 13 is filled with He, is also shortened, a time required after the apparatus is turned on until exposure becomes possible can be shortened greatly.

Embodiment of a Device Manufacturing Method

Figure 10:
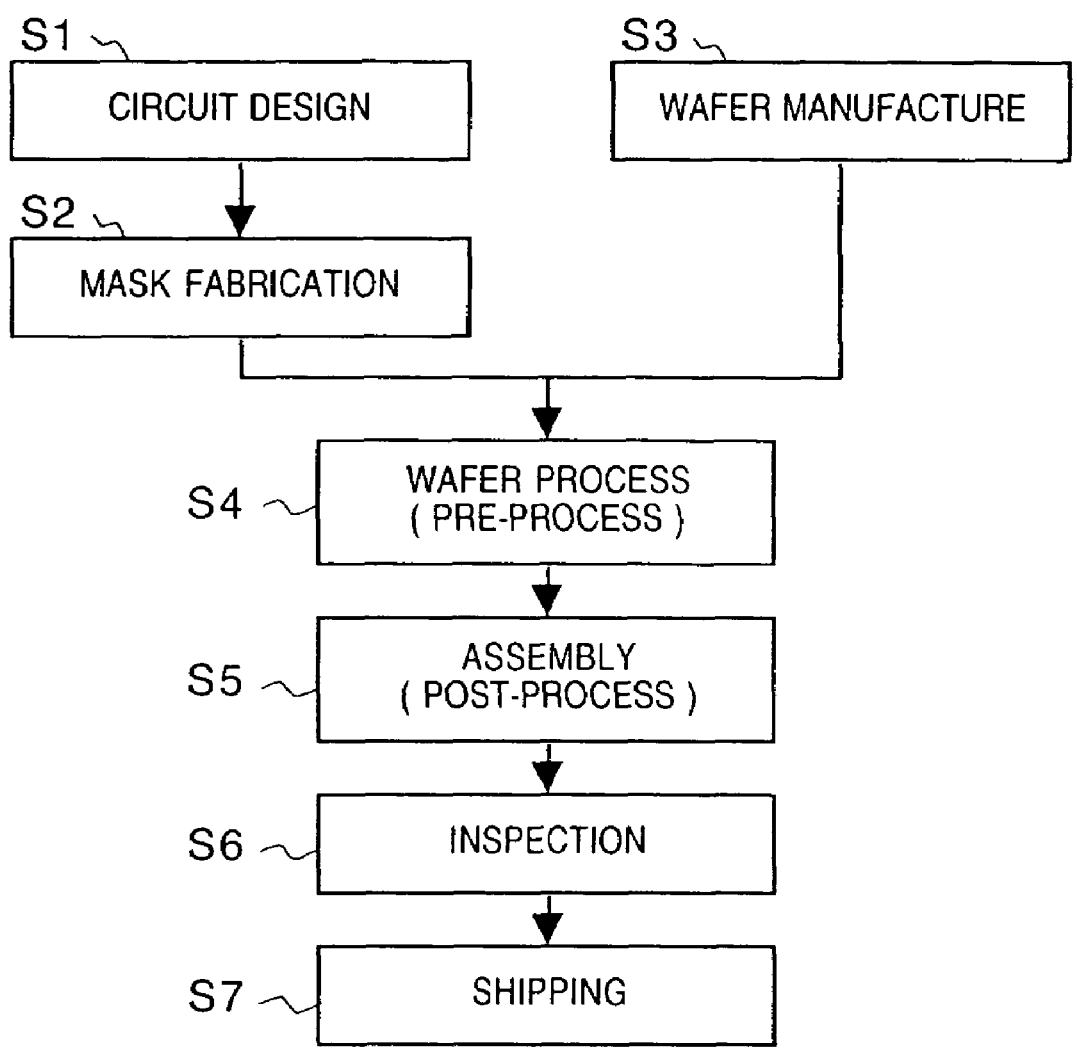
FIG. 10 is a flow chart showing a device manufacturing method which can utilize the exposure apparatus according to the present invention.

An embodiment of a device manufacturing method utilizing the exposure apparatus described above will be described. FIG. 10 shows the flow of the manufacture of a microdevice (e.g., a semiconductor chip such as an IC or LSI, a liquid crystal panel, a CCD, a thin film magnetic head, a micromachine, or the like).

In step 1 (circuit design), pattern design of the device is performed. In step 2 (mask fabrication), a mask formed with the designed pattern is fabricated. In step 3 (wafer manufacture), a wafer is manufactured by using a material such as silicon or glass. Step 4 (wafer process) is called a preprocess where the mask and wafer prepared in the above manner are used to form an actual circuit on the wafer in accordance with lithography. Step 5 (assembly) is called a post-process where the wafer fabricated in step 4 is formed into semiconductor chips. Step 5 includes an assembly step (dicing, bonding), a packaging step (chip encapsulation), and the like. In step 6 (inspection), inspection such as an operation confirmation test, a durability test, and the like of the semiconductor device manufactured in step 5 is performed. The semiconductor device is completed through these steps, and is shipped (step 7).

Figure 11:
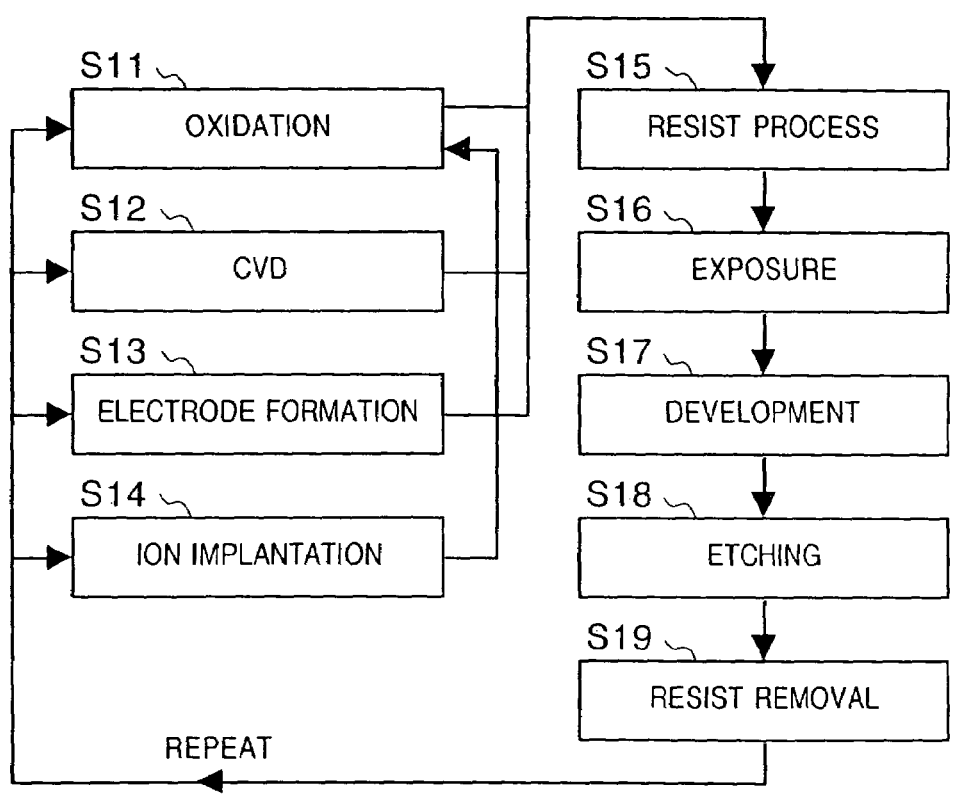
FIG. 11 is a flow chart showing a wafer process of FIG. 10 in detail.

FIG. 11 shows a detailed flow of the above wafer process (step 4).

In step 11 (oxidation), the surface of the wafer is oxidized. In step 12 (CVD), an insulating film is formed on the wafer surface. In step 13 (electrode formation), electrodes are formed on the wafer by vapor deposition. In step 14 (ion implantation), ions are implanted in the wafer. In step 15 (resist process), a resist is applied to the wafer. In step 16 (exposure), the circuit pattern of the mask is printed on each of a plurality of shot regions of the wafer in alignment, and exposed by the exposure apparatus or exposure method described above. In step 17 (development), the exposed wafer is developed. In step 18 (etching), a portion of the wafer other than the developed resist image is removed. In step 19 (resist removal), the resist which has become unnecessary after etching is removed. These steps are repeatedly performed to form circuit patterns on the wafer in a multiple manner.

When the production method of this embodiment is used, a large-size device, which is conventionally difficult to manufactures can be manufactured at a low cost.

As has been described above, according to the present invention, when substituting the gas in the chamber from the first gas to the second gas, for example, the second gas is supplied to a static pressure gas bearing before a start of, simultaneously with, or after a start of exhausting the gas from the chamber. Therefore, the first gas remaining in the static pressure gas bearing can be exhausted easily, so that a time required for the second gas to reach a predetermined impurity can be shortened.

Since evacuation of the static pressure gas bearing is performed simultaneously with vacuum exhaust of the chamber, a time required since the first gas remaining in the static pressure gas bearing is exhausted until the second gas reaches a predetermined impurity can be shortened, and a time required for evacuating the chamber can also be shortened. As a result, a time required for substituting the second gas for the first gas can be further shortened.

As many apparently widely different embodiments of the present invention can be made without departing from the spirit and scope thereof, it is to be understood that the invention is not limited to the specific embodiments thereof except as defined in the appended claims.

What is claimed is:

1. An X-ray exposure apparatus for exposing a substrate to a pattern in an atmosphere of helium, said apparatus comprising:
   a chamber;
   a substituting unit for substituting a gas in said chamber from nitrogen to helium;
   a stage, provided in said chamber, which holds and moves the substrate;
   a static pressure gas bearing, provided in said chamber, which supports said stage;
   a gas supply unit for supplying the helium to said static pressure gas bearing;

a control unit for controlling said gas supply unit to supply the helium to said static pressure gas bearing when said substituting unit substitutes the gas in said chamber from the nitrogen to the helium; and a bearing exhaust unit for exhausting the gas of said static pressure gas bearing.

2. An apparatus according to claim 1, further comprising an evacuating unit for evacuating said chamber by exhausting the gas therefrom when substituting the gas in said chamber from the nitrogen to the helium.

3. An apparatus according to claim 2, wherein said gas supply unit supplies the helium to said static pressure gas bearing before a start of exhausting the gas in said chamber.

4. An apparatus according to claim 2, wherein said gas supply unit supplies the helium to said static pressure gas bearing simultaneously with exhausting of the gas in said chamber.

5. An apparatus according to claim 2, wherein said gas supply unit supplies the helium to said static pressure gas bearing after a start of exhausting the gas in said chamber.

6. An apparatus according to claim 2, wherein said evacuating unit and the bearing exhaust unit are the same.

7. An X-ray exposure apparatus for exposing a substrate to a pattern in an atmosphere of helium, said apparatus comprising:

a chamber;

a substituting unit for exhausting nitrogen from said chamber and introducing the helium into said chamber;

a stage, provided in said chamber, which holds and moves the substrate;

a static pressure gas bearing, provided in said chamber, which supports said stage;

a gas supply pipe for supplying a working gas to said static pressure gas bearing; and a bearing exhaust unit for exhausting a gas of said static pressure gas bearing through said gas supply pipe.

8. An X-ray exposure apparatus for exposing a substrate to a pattern in an atmosphere of helium, said apparatus comprising:

a chamber;

a positioning unit provided in said chamber to position the substrate;

a substituting unit for substituting the helium for nitrogen in said chamber;

a static pressure gas bearing, provided in said chamber, for supporting said positioning unit;

a gas supply unit for supplying a working gas to said static pressure gas bearing;

a control unit for controlling said gas supply unit to supply the helium to said static pressure gas bearing when substituting the gas in said chamber from the nitrogen to the helium; and a bearing exhaust unit for exhausting the gas of said static pressure gas bearing.

9. An apparatus according to claim 8, wherein said X-ray exposure apparatus employs a synchrotron radiation beam as an exposure beam.

10. An X-ray exposure apparatus for exposing a substrate to a pattern in an atmosphere of helium, said apparatus comprising:

a chamber;

a positioning unit provided in said chamber to position the substrate;

a substituting unit for exhausting nitrogen from said chamber and introducing the helium into said chamber;

a static pressure gas bearing, provided in said chamber, for supporting said positioning unit;

a gas supply pipe for supplying a working gas to said static pressure gas bearing; and a bearing exhaust unit for exhausting a gas in said static pressure gas bearing through said gas supply pipe.

11. An apparatus according to claim 10, wherein said X-ray exposure apparatus uses a synchrotron radiation beam as an exposure beam.

12. An atmosphere substituting method of substituting an atmosphere in a chamber of an X-ray exposure apparatus for exposing a substrate to a pattern in an atmosphere of helium, the X-ray exposure apparatus having a stage, provided in the chamber, which holds and moves the substrate, and a static pressure gas bearing, provided in the chamber, which supports the stage, said method comprising:

a substituting step of substituting a gas in the chamber from nitrogen to the helium;

a bearing exhaust step of exhausting, during said substituting step, the nitrogen of the static pressure gas bearing in the chamber; and a gas supply step of supplying the helium to the static pressure gas bearing with a gas supply unit.

13. A method according to claim 12, further comprising an evacuating step of evacuating the chamber by exhausting the gas therefrom when substituting the gas in the chamber from the nitrogen to the helium.

14. A method according to claim 13, wherein the helium is supplied in said gas supply step before a start of exhausting the gas in said evacuating step.

15. A method according to claim 13, wherein the helium is supplied in said gas supply step simultaneously with exhausting of the gas in said evacuating step.

16. A method according to claim 13, wherein the helium is supplied in said gas supply step after a start of exhausting the gas in said evacuating step.

17. A device manufacturing method comprising a substituting step of substituting a gas in a chamber, incorporating a positioning apparatus supported by a static pressure gas bearing, from nitrogen to helium, and an X-ray exposure step of positioning a substrate with the positioning apparatus and exposing the substrate to a pattern after said substituting step, said method comprising:

a bearing exhaust step of exhausting, during said substituting step, the nitrogen of the static pressure gas bearing; and a gas supply step of supplying the helium to the static pressure gas bearing with a gas supply unit.

18. A method according to claim 17, further comprising an evacuating step of evacuating the chamber by exhausting the gas therefrom when substituting the gas in said substituting step, wherein the helium is supplied in said gas supply step before a start of, simultaneously with, or after a start of exhausting the gas in said evacuating step.

19. A method according to claim 18, wherein in said bearing exhaust step, the gas of the static pressure gas bearing is exhausted through a pipe connected thereto, the gas being exhausted simultaneously with exhausting in said evacuating step.

20. A method according to claim 19, wherein an exposure in said X-ray exposure step is performed by using a synchrotron radiation beam.

21. A method according to claim 17, wherein the gas is exhausted in said bearing exhaust step after the helium is supplied in said gas supply step.

22. A device manufacturing method comprising a substituting step of substituting a gas in a chamber, incorporating a positioning apparatus supported by a static pressure gas bearing, by exhausting nitrogen from the chamber and introducing a helium into the chamber, and an X-ray exposure step of positioning a substrate with the positioning apparatus and exposing the substrate to a pattern after said substituting step, said method comprising:

a bearing exhaust step of exhausting the gas of the static pressure gas bearing through a pipe connected thereto simultaneously with exhausting the gas in said substituting step.

23. A method according to claim 22, wherein an exposure in said X-ray exposure step is performed by using a synchrotron radiation beam.

* * * * *